(12) United States Patent
Tsao et al.

(10) Patent No.: US 6,594,294 B1
(45) Date of Patent: Jul. 15, 2003

(54) SEGMENTED-MIRROR VCSEL

(76) Inventors: Jeff Tsao, 12513 Crested Moss Rd., Albuquerque, NM (US) 87122; Chan-Long Shieh, 6739 E. Bar Z La., Paradise Valley, AZ (US) 85253; P. Daniel Dapkus, 1140 Glen View, Fullerton, CA (US) 92835-4033; Jay Yang, 611 Hampshire, # 529, Westlake Village, CA (US) 91361

( * ) Notice: Subject to any disclaimer, the term of this patent is extended or adjusted under 35 U.S.C. 154(b) by 33 days.

(21) Appl. No.: 09/801,282

(22) Filed: Mar. 7, 2001

(51) Int. Cl.[7] .............................. H01S 5/00; H01S 3/08
(52) U.S. Cl. .............................. 372/43; 372/96; 372/99; 372/109; 372/50; 372/29.022; 257/79; 257/103
(58) Field of Search .............................. 372/43, 96, 99, 372/109, 50, 29.022; 257/79, 103

(56) References Cited

U.S. PATENT DOCUMENTS

| | | | | |
|---|---|---|---|---|
| 5,757,837 A | * | 5/1998 | Lim et al. | 372/50 |
| 6,238,944 B1 | * | 5/2001 | Floyd | 438/45 |
| 6,269,109 B1 | * | 7/2001 | Jewell | 372/43 |
| 6,277,696 B1 | * | 8/2001 | Carey et al. | 438/289 |
| 6,411,638 B1 | * | 6/2002 | Johnson et al. | 372/46 |

* cited by examiner

*Primary Examiner*—Eddie Lee
*Assistant Examiner*—Joseph Nguyen
(74) *Attorney, Agent, or Firm*—Parsons & Goltry; Robert A. Parsons; Michael W. Goltry

(57) ABSTRACT

A segmented-mirror vertical cavity surface emitting laser includes an active portion with an active region having at least one quantum well and a lateral dimension. A first mirror stack is positioned on a first opposed major surface of the active portion and extends laterally beyond the lateral dimension of the active region. A second mirror stack is positioned on the opposed major surface and extends laterally beyond the lateral dimension of the active region. The second mirror stack is segmented into two or more zones. In the case where there are two zones, in the first zone there would be a first reflectivity and a first thermal impedance, and in the second zone there would be a second reflectivity lower than the first reflectivity and a second thermal impedance lower than the first thermal impedance.

28 Claims, 3 Drawing Sheets

SEGMENTED-MIRROR VCSEL

FIELD OF THE INVENTION

This invention relates to vertical cavity surface emitting lasers (VCSELs) and more particularly to VCSELs with dielectric mirrors.

BACKGROUND OF THE INVENTION

Vertical cavity surface emitting lasers (VCSELs) include first and second mirror stacks formed on opposite sides of an active area. The active area includes one or more quantum wells capable of generating light as electrical carriers are supplied. Each mirror stack includes a plurality of pairs of mirrors designed to reflect a portion of light generated in the active area back into the active area for regeneration. The pairs of mirrors in the mirror stacks are formed of a material system generally consisting of two materials having different indices of refraction to provide the reflectivity. Two types of mirror stacks are prevalent in the art: semiconductor distributed Bragg reflectors (DBRs) formed using relatively expensive and complex epitaxial growth; and dielectric mirror stacks, which can be formed using much simpler chemical and physical deposition techniques. Also, the epitaxially grown DBR mirror stacks must be chosen to be easily lattice matched to the other portions of the VCSEL, which severely limits the reflectivity that can be obtained. Because of this limitation on reflectivity, epitaxially grown DBR mirror stacks generally contain twenty or more pairs of mirrors (pairs of layers).

In conventional VCSELs in the 760 nm to 1050 nm range, conventional material systems such as AlGaAs perform adequately. However, for VCSELs outside of this range, other material systems, whose overall performance is poorer, must be used. For example, longer-wavelength light can be generated by using a VCSEL having an InP-based active region. When an InP-based active region is used, however, the epitaxial DBRs lattice matched to the supporting substrate and the active region do not provide enough reflectivity for the VCSELs to operate because of the insignificant difference in the refractive indices between the two DBR constituents. Dielectric mirror stacks can be used instead, but they suffer from poor thermal conductivity. Since the performance of these long-wavelength materials is very sensitive to temperature, the thermal conductivity of the mirror stacks is very important.

At least two different embodiments of VCSELs have been suggested in an effort to overcome the thermal conductivity problem. In a traditional short-cavity, large-diameter-mirror VCSEL, almost all the heat must flow vertically through a bottom mirror. But if the bottom mirror has a modest thermal conductivity, i.e., if it is dielectric, the vertical heat flow will be poor. In a long-cavity, small-diameter-mirror VCSEL, heat can also flow laterally (or diagonally), bypassing the bottom mirror. However, in the long-cavity, small-diameter-mirror VCSEL the reflectance of the optical field, which spills over laterally beyond the beam-waist spot size (approximately the lateral dimension of the active area), is decreased. This decrease in reflectance reduces the efficiency and operating performance of the VCSEL. If the mirror diameter is increased, to capture the optical field spill-over, then the diagonal heat flow will be cut off or seriously reduced.

Accordingly it is highly desirable to provide VCSELs with mirror stacks that rectify these shortcomings.

It is an object of the present invention to provide VCSELs with improved mirror stacks.

It is another object of the present invention to provide VCSELs with improved mirror stacks that are easier to manufacture.

It is another object of the present invention to provide VCSELs with improved mirror stacks that do not require expensive and complicated epitaxially grown mirrors.

It is still another object of the present invention to provide VCSELs with improved mirror stacks that are tailored to enhance a desired or single transverse mode of operation.

It is a further object of the present invention to provide VCSELs with improved mirror stacks that provide good reflectivity and thermal conductivity with less complexity and costly manufacturing techniques.

SUMMARY OF THE INVENTION

To achieve the objects and advantages specified above and others, a segmented-mirror vertical cavity surface emitting laser (VCSEL) and methods of fabrication are provided. The segmented-mirror VCSEL includes an active portion with an active region having at least one quantum well and a lateral dimension. A first dielectric mirror stack is positioned on a first opposed major surface of the active portion and extends laterally beyond the lateral dimension of the active region. A second dielectric mirror stack is positioned on the opposed major surface and extends laterally beyond the lateral dimension of the active region. The second dielectric mirror stack includes portions defining first and second reflectance zones with mirror pairs in at least one of the portions being segmented to provide a first reflectivity and a first thermal impedance in the first reflectance zone, a second reflectivity lower than the first reflectivity in the second reflectance zone, and a second thermal impedance lower than the first thermal impedance in-the second reflectance zone.

In a preferred embodiment, the active portion is formed by epitaxially growing heat/current spreading layers on opposed sides of an active region. The active portion is grown on a sacrificial support. A dielectric mirror stack is deposited on one surface of the active portion so as to define the first and second reflectance zones. At least some of the layers of the dielectric mirror stack are patterned to provide segmented layers which cooperate to provide the different reflectances and thermal impedances. A base is affixed to the dielectric mirror stack and the sacrificial support is removed. A dielectric mirror stack is then deposited on the opposed surface of the active portion. In some applications the segmented layers can be tailored to enhance a desired mode of operation. For example, the segmented layers can be tailored to enhance a TEM00 mode of operation and to discriminate against higher order modes of operation.

BRIEF DESCRIPTION OF THE DRAWINGS

Referring to the drawings.

DESCRIPTION OF THE PREFERRED EMBODIMENT

Figure 1:
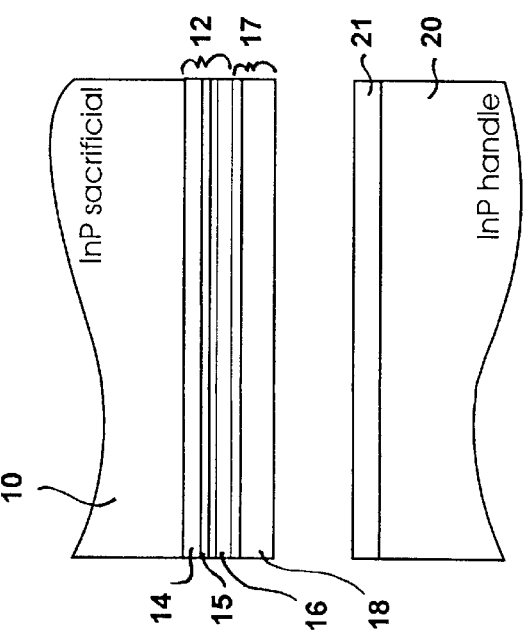
FIG. 1 is a simplified schematic view illustrating several sequential steps in the fabrication of a vertical cavity surface emitting laser in accordance with the present invention, portions thereof broken away.

Turning now to FIG. 1, a simplified schematic view is illustrated showing several sequential steps in the fabrication of a vertical cavity surface emitting laser (VCSEL) in accordance with the present invention. As will be understood by those skilled in the art, VCSELs are generally fabricated with a circular cross-section, so that the figures in this disclosure generally illustrate a sectional view along a diameter of the VCSEL.

In a first step of a preferred fabrication process, a sacrificial support 10 is provided. An active portion 12 is grown on the surface of support 10 in a well known manner. While many materials may be used, in this preferred embodiment support 10 includes InP and active portion 12 is epitaxially grown. For example, active portion 12 may include any long wavelength material, such as InP, InAlGaP, InAlGaN, or other combinations of these materials. Further, active portion 12 includes a first heat/current spreading layer 14, an active region 15 including at least one quantum well, and a second heat/current spreading layer 16. As will be understood by those skilled in the art, each of spreading layer 14, active region 15, and spreading layer 16 include a plurality of sub-layers provided to achieve the desired result. Further, tunnel junctions may be provided on one or both major surfaces of active region 15 to improve the current distribution, as will be explained in more detail below.

A dielectric mirror stack 17 is positioned on the exposed major surface of heat/current spreading layer 16. Dielectric mirror stack 17 includes a plurality of mirror pairs which, as will be explained in more detail below, are specifically designed to provide a desired reflectance and thermal impedance. Here it will be understood that in this preferred embodiment stack 17 is a dielectric mirror stack for simplicity of manufacturing, but other mirror stacks, such as semiconductor DBR mirror stacks, could be used if desired. Blanket layers 18 of gold (Au) and a gold-zinc (AuZn) compound are deposited on the surface of dielectric mirror stack 17. In this preferred embodiment, the gold (Au), aluminum (Al), silver (Ag), or other highly reflecting metal layers are incorporated in dielectric mirror stack 17, as will be described in more detail below, to provide a desired reflectance and thermal impedance. The gold-zinc layer or layers are provided as a "glue". A base 20, which in this embodiment also includes InP based semiconductor material, has a layer 21 of a gold-zinc (AuZn) compound deposited on the surface. Layer 21 is also designed to operate as a "glue" in conjunction with blanket layers 18 to firmly affix base 20 to the described assembly.

As will be understood presently, base 20 operates generally as a handle to facilitate further processing steps. Also, base 20 may include a permanent structure for the mounting of the VCSEL, such as a semiconductor chip or the like. While a specific embodiment for base 20 is disclosed, other embodiments and methods of attachment can be utilized. For example, base 20 can be plated, wafer bonded, etc.

Figure 2:
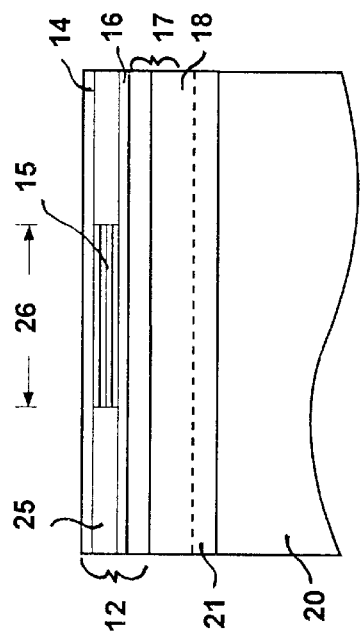

Once base 20 is firmly affixed to the assembly, sacrificial support 10 is removed to expose the opposed major surface of first heat/current spreading layer 14 of active portion 12, as illustrated schematically in FIG. 2. Using base 20 as a handle, additional operations can now be performed. In one additional operation, a lateral portion 25 of active region 15 is processed to define a lateral dimension 26 of active region 15. Active region 15 does not operate (or technically exist) beyond lateral dimension 26. The processing of lateral portion 25 can take the form of several different methods including damaging the crystalline structure by implanting any of various materials (e.g., oxygen or hydrogen molecules), oxidizing aluminum containing layers included in active region 15, laterally etching one or more of the various layers forming active region 15, disrupting electrical tunneling structures by in-diffusion of impurities, etc. Generally, as will be understood, the processing of lateral portion 25 not only renders it inactive for the generation of light but also renders it non-conductive to electrical current.

Figure 3:
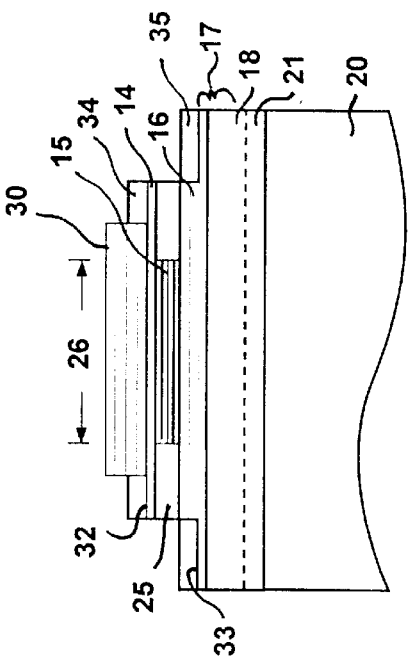
FIGS. 2 and 3 are simplified schematic views illustrating several additional steps in the fabrication process.

Referring additionally to FIG. 3, a dielectric mirror stack 30 is deposited on the exposed surface of the opposed major surface of first heat/current spreading layer 14. Here it will be understood that in this preferred embodiment stack 30 is a dielectric mirror stack for simplicity of manufacturing, but other mirror stacks (e.g., semiconductor DBR mirror stacks) could be used if desired. Mirror stack 30 extends laterally beyond lateral dimension 26 of active region 15 to ensure the reflection of the optical field spill-over.

Generally, for convenience (reduction of processing steps), during the patterning of dielectric mirror stack 30, laterally extending portions of heat/current spreading layer 14, lateral portion 25 of active region 15, and heat/current spreading layer 16 are removed in steps to expose surfaces 32 and 33 of heat/current spreading layer 14 and heat/current spreading layer 16, respectively. Surfaces 32 and 33 are then metallized to provide two electrical contacts 34 and 35, respectively, for supplying current to current pump the VCSEL. In this preferred embodiment, both contacts 34 and 35 and both heat/current spreading layers 14 and 16 are doped for n-conduction to improve the electrical conduction and current spreading across the upper and lower surfaces of active region 15. As will be understood, the n-conduction is facilitated by incorporating p-n tunnel junctions on one or both of the upper and lower surfaces of active region 15. It will of course be understood by those skilled in the art that in this preferred embodiment current pumping is disclosed as the preferred activation method but with some modifications optical pumping could be used.

Generally, as explained briefly above, the formation of semiconductor DBR mirror stacks is very costly, complex, and time consuming. For example, a standard DBR mirror stack requires twenty or more mirror pairs (forty layers of semiconductor material) on each side of the active region to achieve the required reflectance. Since the layers of each pair are formed of different material, the epitaxial growth process becomes extremely complex. Because of the complexity and cost of fabrication facilities, many smaller companies must have VCSELs with DBR mirror stacks manufactured for them. In contrast, dielectric mirror stacks are relatively simple to deposit and, hence, the manufacturing can be performed in much simpler facilities, allowing many small companies to manufacture their own VCSELs. However, a major problem with dielectric mirrors is the fact that they generally do not provide sufficient thermal conduction. Generally, the performance of VCSELs, and especially long-wavelength VCSELs, is very sensitive to temperature. Thus, the thermal conductivity of the mirror stacks is very important.

Figure 4:
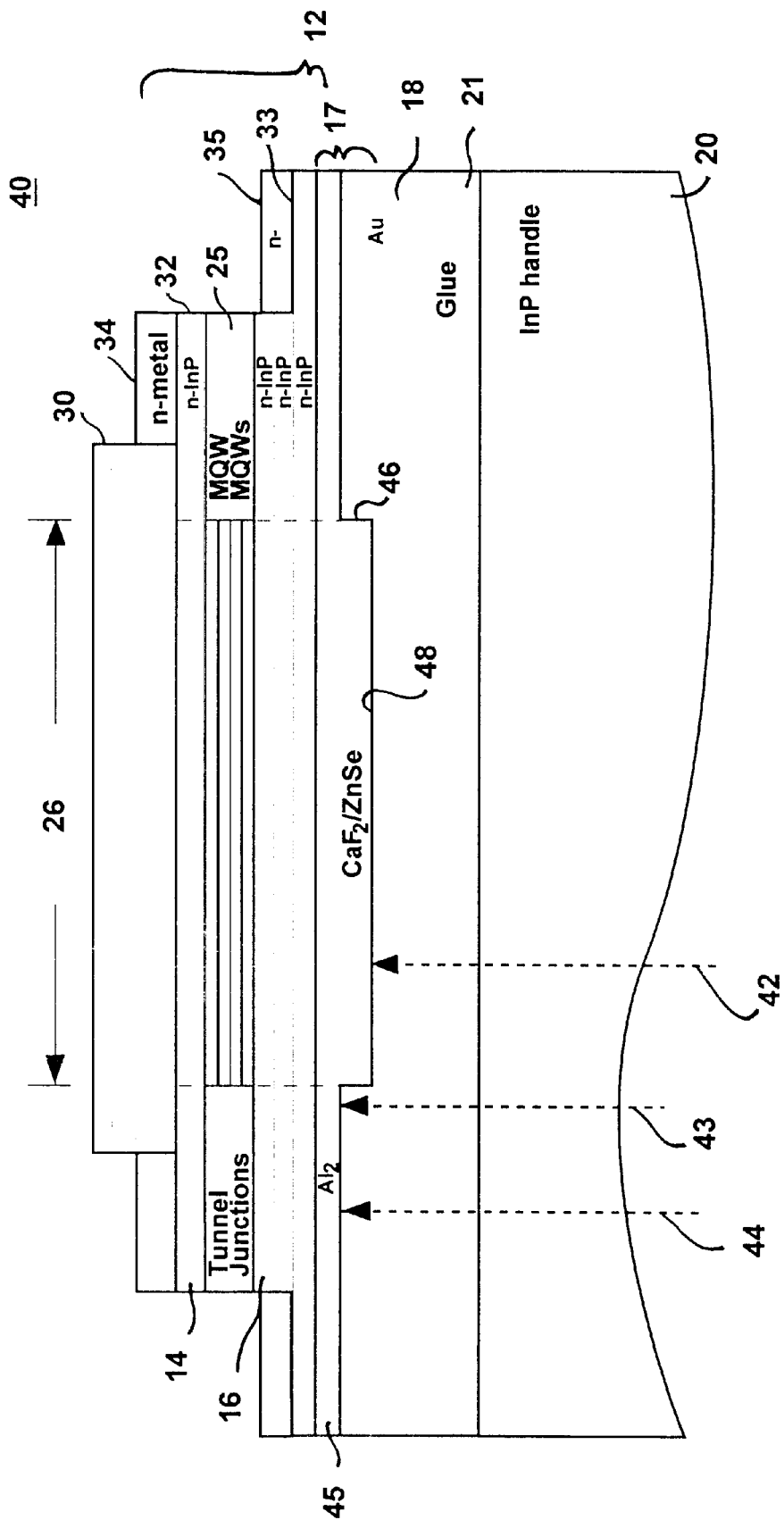
FIG. 4 is a simplified sectional view of a vertical cavity surface emitting laser in accordance with the present invention, portions thereof broken away.

Referring now to FIG. 4, a simplified sectional view is illustrated of a VCSEL 40 in accordance with the present invention. Various components of VCSEL 40 that correspond to components of the above discussion are designated with similar numbers for convenience in understanding. In the embodiment illustrated in FIG. 4, dielectric mirror stack 30 can be formed of any convenient dielectric material that provides the desired reflectance (e.g., $SiO_2/TiO_2$), since current and heat conduction are not required. Generally, any, or at least most, of the heat generated in VCSEL 40 is conducted by means of dielectric stack 16. Thus, dielectric stack 16 must have a relatively high reflectance and a relatively low thermal impedance.

To facilitate these features, dielectric stack 16 is fabricated to include a plurality of reflectance zones. In this specific embodiment, three reflectance zones 42, 43, and 44 are provided. To form the various reflectance zones, dielectric stack 16 includes various portions with mirror pairs in at least one of the portions being segmented to provide a first reflectivity and a first thermal impedance in reflectance zone 42, a second reflectivity lower than the first reflectivity and a second thermal impedance lower than the first thermal impedance in reflectance zone 43, and a third reflectivity lower than the second reflectivity and a third thermal impedance lower than the second thermal impedance in reflectance zone 43. It will of course be understood from the following description that more or fewer reflectance zones can be included if desired or to achieve various applications.

During the following discussion of the specific embodiment illustrated in FIG. 4, it will be understood that each layer of a mirror pair is approximately one quarter wave length thick at the operating frequency so that a mirror pair is one half wavelength thick to provide the required phase matching. Dielectric stack 16 includes a first portion, which in this specific embodiment is a single layer 45 (one half mirror pair or λ/4) of dielectric (e.g., $Al_2O_3$ or $AlF_3$) deposited on the surface of spreading layer 16. Layer 45 is a blanket layer that extends laterally beyond lateral dimension 26 of active region 15 to the outer limits of VCSEL 40.

Dielectric stack 16 includes a second portion, which in this specific embodiment is formed on layer 45 and includes one and one half mirror pairs or three segmented layers designated 46. Each segmented layer of layers 46 includes a centrally located segment of $CaF_2$ or ZnSe ($CaF_2$/ZnSe forming a mirror pair) with a laterally disposed segment of Au. Segmented layers 46 are aligned approximately centrally with active region 15 and extend laterally beyond lateral dimension 26 of active region 15. It will of course be understood that layers 46 are most conveniently formed by blanket depositions and patterning in a well known manner. In this preferred embodiment, the segments of $CaF_2$/ZnSe of layers 46 extend laterally beyond lateral dimension 26 approximately one micron. Thus, for example, the segments of $CaF_2$/ZnSe of layers 46 have a diameter approximately 2 microns greater than the diameter of active region 15.

Dielectric stack 16 further includes a third portion, which is formed on the surface of layers 46 and includes two and one half mirror pairs or five segmented layers designated 48. Each segmented layer of layers 48 includes a centrally located segment of $CaF_2$ or ZnSe ($CaF_2$/ZnSe forming a mirror pair) with a laterally disposed segment of Au. Segmented layers 48 are aligned approximately centrally with active region 15 and extend laterally beyond lateral dimension 26 of active region 15. It will of course be understood that layers 48 are most conveniently formed by blanket depositions and patterning in a well known manner. In this preferred embodiment, the segments of $CaF_2$/ZnSe of layers 48 extend laterally a distance shorter than lateral dimension 26 approximately one micron. Thus, for example, the segments of $CaF_2$/ZnSe of layers 48 have a diameter approximately 2 microns less than the diameter of active region 15.

Here it should be noted that the Au segments of layers 46 (the second portion) cooperate with layer 45 of the first portion to form reflectance zone 44 with an $Al_2O_3$/Au mirror pair having a reflectance of approximately 98.2% and a vertical thermal impedance of approximately 0.1° C./mW. Also, the Au segments of layers 48 (the third portion) cooperate with layers 46 of the second portion to form reflectance zone 43 with two $CaF_2$/ZnSe/Au mirror pairs having a reflectance of approximately 99.5% and a vertical thermal impedance less than approximately 2.8° C./mW. Further, the centrally located segments of layers 46 and 48, along with the central portion of layer 45 and Au 18 deposited on mirror stack 16, cooperate to form reflectance zone 42 having a reflectance of 99.9% and a vertical thermal impedance of approximately 2.8° C./mW.

Figure 5:
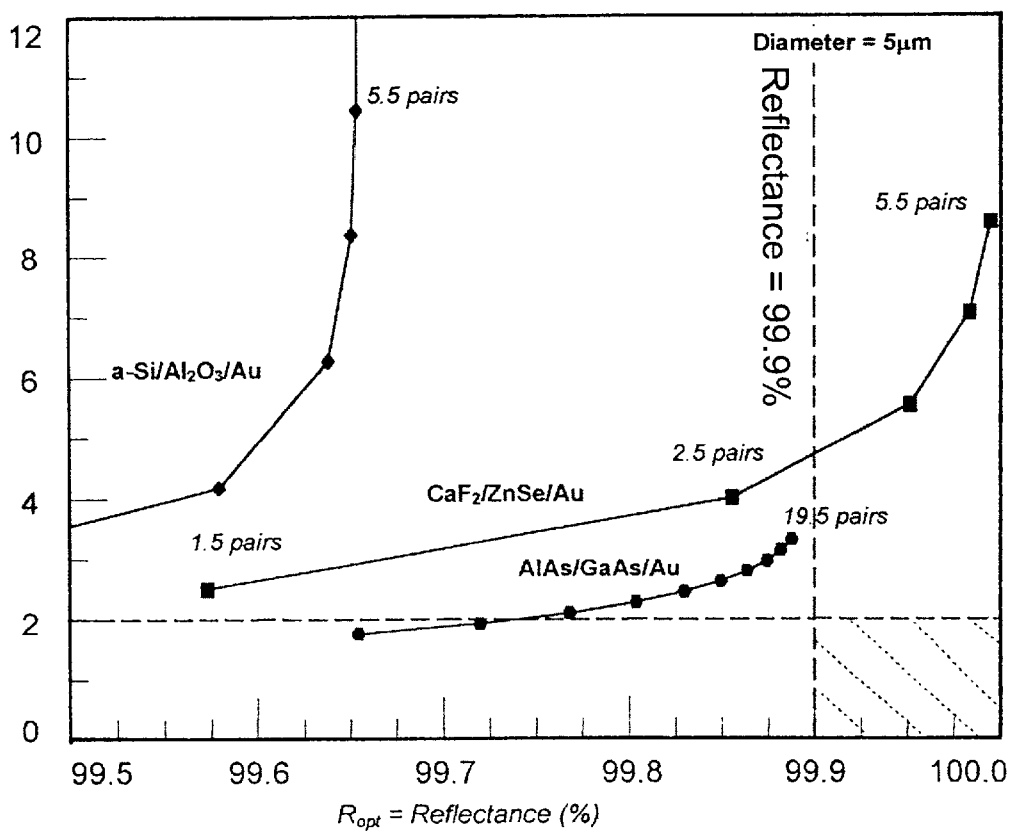
FIG. 5 is a graphical representation of the reflectance versus thermal impedance of various materials used in the formation of vertical cavity surface emitting lasers, illustrating the number of pairs of mirrors required to achieve the illustrated results.

Referring additionally to FIG. 5, a graphical representation is illustrated of the reflectance versus vertical thermal impedance of various materials used in the formation of VCSEL 40. Also illustrated is the number of pairs of mirrors required to achieve the illustrated results. For example, approximately twenty pairs of AlAs/GaAs with an Au backing are required to achieve approximately 99.9% reflectance, while three pairs of $CaF_2$/ZnSe with Au backing achieves the same result. However, the vertical thermal impedance of the twenty pairs of AlAs/GaAs is approximately 3.5° C./mW while the vertical thermal impedance of the three pairs $CaF_2$/ZnSe is approximately 4.5° C./mW. However, by providing the above described novel segmented layers, lateral thermal conductance is provided which, in conjunction with the vertical thermal conduction, substantially reduces the overall thermal impedance while maintaining a high reflectance. Here it should be noted that while specific materials for mirror pairs have been described as $CaF_2$/ZnSe, other materials, including other fluorides and zinc compounds can be used. For example, ZnS could be used instead of ZnSe and $ThF_2$ could be used instead of $CaF_2$, if desired.

In the design of VCSEL 40, reflectance zone 42 is designed to intercept approximately 75% of the optical beam or the light generated by the active region, reflectance zone 43 is designed to intercept approximately 20% of the optical beam, and reflectance zone 44 is designed to intercept approximately 5% of the optical beam (generally the optical field spill-over). Thus, the total reflectance for VCSEL 40 is approximately 99.8% and the total thermal impedance of VCSEL 40 is approximately 1.4° C./mW.

A further and important advantage that is realized with the novel design of VCSEL 40 is that the reflectance zones are, or can be, tailored to enhance a TEM00 mode of operation and to discriminate against higher order modes of operation. This can be seen more clearly by noting that the TEM00 mode of operation has a generally smooth response curve with the peak at the center of the cavity (i.e., generally centered along the axis of VCSEL 40 with the much lower amplitude skirts extending outwardly toward the edges or zones 43 and 44). Thus, the maximum reflectance occurs at the peak of the TEM00 mode of operation. Conversely, a second order mode, for example, has a near null at the center of the cavity with two peaks spaced apart from the center of the cavity. Thus the null appears at the maximum reflectance and the peaks appear at a much lower reflectance so that there will generally not be enough reflectance to support lasing. Therefore, VCSEL 40 is or can be tailored to have very good single-transverse mode performance. Similarly, the various zones of dielectric mirror stack 16 can be formed with additional spacer layers with thicknesses (number of layers) and lateral dimensions such as to define mirror curvature providing transverse mode definition and guiding.

Thus, a VCSEL has been described which can be manufactured much more simply and cheaply because it incorporates a dielectric mirror stack. The dielectric mirror stack is fabricated with segmented mirror portions to substantially improve the thermal conductivity of the dielectric mirror stack. The dielectric mirror stack with segmented mirror portions can also be tailored to guide and enhance a TEM00 mode of operation and to discriminate against higher order transverse modes of operation. While a VCSEL has been described that includes a dielectric mirror stack, it should be understood that in some applications it may be desirable to utilize the novel segmented mirror approach with a semiconductor mirror stack. In such an embodiment, it will be understood that some gain in temperature distribution could still be realized and the VCSEL could still be tailored to enhance a TEM00 mode of operation and to discriminate against higher order transverse modes of operation.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A segmented-mirror vertical cavity surface emitting laser comprising:
    an active portion including an active region having at least one quantum well and a lateral dimension, the active portion defining first and second opposed major surfaces;
    wherein the active portion further includes a heat spreading layer positioned adjacent to the second opposed major surface;
    a first mirror stack positioned on the first opposed major surface and extending laterally beyond the lateral dimension of the active region;
    a second mirror stack positioned on the second opposed major surface and extending laterally beyond the lateral dimension of the active region, the second mirror stack including portions positioned in thermal communication with the heat spreading layer, the portions defining first and second reflectance zones with mirror pairs in at least one of the portions being segmented to provide a first reflectivity and a first thermal impedance in the first reflectance zone, a second reflectivity lower than the first reflectivity in the second reflectance zone, and a second thermal impedance lower than the first thermal impedance in the second reflectance zone; and
    wherein the portion of the second mirror stack in thermal communication with the heat spreading layer has a vertical thermal impedance gradient which decreases beyond the lateral dimension of the active region.

2. A segmented-mirror vertical cavity surface emitting laser as claimed in claim 1 wherein the first reflectance zone is aligned centrally with the active region and extends laterally a distance equal to the lateral dimension of the active region.

3. A segmented-mirror vertical cavity surface emitting laser as claimed in claim 2 wherein the second reflectance zone is aligned with the active region and extends laterally beyond the first reflectance zone.

4. A segmented-mirror vertical cavity surface emitting laser as claimed in claim 3 further including a third reflectance zone aligned with the active region and extending laterally beyond the second reflectance zone.

5. A segmented-mirror vertical cavity surface emitting laser as claimed in claim 1 wherein the active portion includes a first current spreading layer lattice matched to a first surface of the active region and a second current spreading layer lattice matched to a second opposed surface of the active region, the first and second current spreading layers extending laterally beyond the lateral dimension of the active region.

6. A segmented-mirror vertical cavity surface emitting laser as claimed in claim 1 wherein the second mirror stack includes a first portion positioned on the second opposed major surface of the active portion and extending laterally beyond the lateral dimension of the active region.

7. A segmented-mirror vertical cavity surface emitting laser as claimed in claim 6 wherein the second mirror stack further includes a second portion positioned on the first portion, the second portion including segmented layers with each layer including a first centrally positioned segment and a second laterally disposed segment, the second laterally disposed segment extending laterally beyond the lateral dimension of the active region.

8. A segmented-mirror vertical cavity surface emitting laser as claimed in claim 7 wherein the first centrally positioned segment of the second portion is designed to cooperate with the first portion to define the first reflectance zone and the second laterally disposed segment of the second portion is designed to cooperate with the first portion to define the second reflectance zone.

9. A segmented-mirror vertical cavity surface emitting laser as claimed in claim 8 wherein the first and the second reflectance zones are tailored to enhance a single transverse mode of operation.

10. A segmented-mirror vertical cavity surface emitting laser as claimed in claim 9 wherein the first and the second reflectance zones are tailored to enhance a TEM00 mode of operation and to discriminate against higher order modes of operation.

11. A segmented-mirror vertical cavity surface emitting laser as claimed in claim 1 wherein the active portion includes InP based semiconductor materials.

12. A segmented-mirror vertical cavity surface emitting laser as claimed in claim 1 wherein the active portion includes InAlGaP based semiconductor materials.

13. A segmented-mirror vertical cavity surface emitting laser as claimed in claim 1 wherein the active portion includes InAlGaN based semiconductor materials.

14. A segmented-mirror vertical cavity surface emitting laser as claimed in claim 11 wherein the first portion of the second mirror stack includes at least a layer of $Al_2O_3$.

15. A segmented-mirror vertical cavity surface emitting laser as claimed in claim 14 wherein the first centrally positioned segment of the second portion of the second mirror stack includes a plurality of pairs of layers with one layer of each pair including a zinc compound and the other layer of each pair including a fluoride.

16. A segmented-mirror vertical cavity surface emitting laser as claimed in claim 15 wherein the one layer of each pair includes ZnSe and the other layer of each pair includes $CaF_2$.

17. A segmented-mirror vertical cavity surface emitting laser as claimed in claim 15 wherein the second laterally disposed segment of the second portion of the second mirror stack includes one of gold (Au), aluminum (Al), and silver (Ag).

18. A segmented-mirror vertical cavity surface emitting laser as claimed in claim 15 wherein the second mirror stack further includes a third portion positioned on the second portion.

19. A segmented-mirror vertical cavity surface emitting laser as claimed in claim 18 wherein the third portion of the second mirror stack includes at least one layer of Au.

20. A segmented-mirror vertical cavity surface emitting laser as claimed in claim 7 wherein the second mirror stack further includes a third portion positioned on the second portion, the third portion including segmented layers with each layer including a first centrally positioned segment and a second laterally disposed segment, the second laterally disposed segment extending laterally beyond the lateral dimension of the active region, the first, second, and third portions cooperating to define first, second, and third reflectance zones.

21. A segmented-mirror vertical cavity surface emitting laser as claimed in claim 20 wherein the first, second, and third portions of the second mirror stack include a plurality of layers in a plurality of reflectance zones with different thicknesses and lateral dimensions such as to define mirror curvature providing transverse mode definition and guiding.

22. A segmented-mirror vertical cavity surface emitting laser as claimed in claim 20 wherein the first reflectance zone is constructed with a reflectance of at least 99.5%, the second reflectance zone is constructed with a reflectance of at least 99%, and the third reflectance zone is constructed with a reflectance of at least 98%.

23. A segmented-mirror vertical cavity surface emitting laser as claimed in claim 20 wherein the first reflectance zone is centrally positioned to receive approximately 75% of light generated by the active region, the second reflectance zone is laterally displaced to receive approximately 20% of light generated by the active region, and the third reflectance zone is laterally displaced to receive at least 5% of light generated by the active region.

24. A segmented-mirror vertical cavity surface emitting laser comprising:

an active portion including an active region having at least one quantum well and a lateral dimension, the active portion defining first and second opposed major surfaces;

wherein the active portion further includes a heat spreading layer positioned adjacent to the second opposed major surface;

a first mirror stack positioned on the first opposed major surface and extending laterally beyond the lateral dimension of the active region;

a second mirror stack positioned on the second opposed major surface and extending laterally beyond the lateral dimension of the active region, the second mirror stack including portions positioned in thermal communication with the heat spreading layer, the portions defining first and second reflectance zones with mirror pairs in at least one of the portions being segmented to provide a first reflectivity and a first thermal impedance in the first reflectance zone, a second reflectivity lower than the first reflectivity in the second reflectance zone, and a second thermal impedance lower than the first thermal impedance in the second reflectance zone;

the reflectance zones of the second mirror stack being designed and positioned to provide a total reflectance of at least 99.7% and a total thermal impedance of at most 1.2° C./mW; and wherein the portion of the second mirror stack in thermal communication with the heat spreading layer has a vertical thermal impedance gradient which decreases beyond the lateral dimension of the active region.

25. A segmented-mirror vertical cavity surface emitting laser as claimed in claim 24 wherein the second mirror stack includes a first portion positioned on the second opposed major surface of the active portion and extending laterally beyond the lateral dimension of the active region.

26. A segmented-mirror vertical cavity surface emitting laser as claimed in claim 25 wherein the second mirror stack further includes a second portion positioned on the first portion, the second portion including segmented layers with each layer including a first centrally positioned segment and a second laterally disposed segment, the second laterally disposed segment extending laterally beyond the lateral dimension of the active region.

27. A segmented-mirror vertical cavity surface emitting laser as claimed in claim 26 wherein the first centrally positioned segment of the second portion is designed to cooperate with the first portion to define the first reflectance zone and the second laterally disposed segment of the second portion is designed to cooperate with the first portion to define the second reflectance zone.

28. A segmented-mirror vertical cavity surface emitting laser as claimed in claim 24 wherein the first and the second reflectance zones are tailored to enhance a TEM00 mode of operation and to discriminate against higher order modes of operation.

* * * * *